(12) United States Patent
Poo

(10) Patent No.: US 8,443,132 B2
(45) Date of Patent: May 14, 2013

(54) METHOD AND APPARATUS FOR CASCADE MEMORY

(75) Inventor: Teng Pin Poo, Singapore (SG)

(73) Assignee: Trek 2000 International Ltd, Singapore (SG)

( * ) Notice: Subject to any disclaimer, the term of this patent is extended or adjusted under 35 U.S.C. 154(b) by 513 days.

(21) Appl. No.: 12/189,610

(22) Filed: Aug. 11, 2008

(65) Prior Publication Data

US 2009/0070522 A1 Mar. 12, 2009

Related U.S. Application Data

(63) Continuation of application No. PCT/SG2006/000235, filed on Aug. 17, 2006.

(30) Foreign Application Priority Data

Feb. 27, 2006 (SG) .................................. 200601251

(51) Int. Cl.
*G06F 13/00* (2006.01)
(52) U.S. Cl.
USPC ........................................................ 711/103
(58) Field of Classification Search ........................ None
See application file for complete search history.

(56) References Cited

U.S. PATENT DOCUMENTS

| | | | |
|---|---|---|---|
| 5,696,454 A * | 12/1997 | Trimberger ..................... | 326/38 |
| 5,818,350 A | 10/1998 | Estakhri et al. | |
| 5,987,554 A * | 11/1999 | Liu et al. ....................... | 710/310 |
| 6,657,914 B1 | 12/2003 | Ong et al. | |
| 6,715,044 B2 | 3/2004 | Lofgren et al. | |
| 6,912,646 B1 * | 6/2005 | Khu .............................. | 711/219 |
| 7,265,578 B1 * | 9/2007 | Tang et al. ..................... | 326/40 |
| 2002/0138676 A1* | 9/2002 | Kendall et al. .................. | 710/74 |
| 2003/0052710 A1* | 3/2003 | Lasselet Goldfinch ......... | 326/37 |
| 2004/0225762 A1* | 11/2004 | Poo ................................ | 710/36 |

FOREIGN PATENT DOCUMENTS

| | | |
|---|---|---|
| JP | 63-79290 | 9/1988 |
| WO | WO 96/32724 | 10/1996 |
| WO | WO 99/23662 | 5/1999 |

OTHER PUBLICATIONS

In System Programmable Configuration PROM, AT17F040 AT17F080, ATMEL 2002.*
Supplementary European Search Report and Annex to the European Search Report.

* cited by examiner

*Primary Examiner* — Duc Doan
(74) *Attorney, Agent, or Firm* — Venable LLP; Robert S. Babayi; Thomas A. Negley

(57) ABSTRACT

A system and method of operating a cascade of a plurality of memory devices connected in series is disclosed. In one aspect, there is a memory controller operatively connected to the memory cell and a cascade circuit configured to enable a subsequent memory device in a cascade of memory devices.

5 Claims, 4 Drawing Sheets

METHOD AND APPARATUS FOR CASCADE MEMORY

CROSS-REFERENCE TO RELATED APPLICATIONS

This application is a continuation application, and claims the benefit under 35 U.S.C. §§120 and 365, of PCT Application No. PCT/SG2006/000235, filed on Aug. 17, 2006, which is hereby incorporated by reference.

BACKGROUND

1. Field of the Invention

This invention relates to a method and apparatus for cascade memory and refers particularly, though not exclusively, to a method and apparatus for cascading multiple memory devices.

2. Description of Related Technology

The known method and apparatus accessing for multiple memory modules is shown in FIG. 1 where CS is for "Chip Select" or "Chip Enable". Prior to any command being sent, or any communication commenced, all non-volatile memory devices generally need to be enabled. This enabling is required so that only one memory device is on at any one time. In FIG. 1, there are three non-volatile memory devices 101, 102 and 103 operatively connected to a microcontroller 104. Therefore, the microcontroller 104 generally needs three chip select pins and connects 105, 106 and 107 to control the three memories 101, 102 and 103. The microcontroller 104 can then be utilized to turn on any one of the memory devices 101, 102 and 103 at any time to access the relevant memory. At no time can more than one of the memory devices 101, 102 and 103 be on.

SUMMARY OF CERTAIN INVENTIVE ASPECTS

In accordance with a first aspect there is provided a memory device comprising:
(a) a memory cell;
(b) a memory controller operatively connected to the memory cell; and
(c) a cascade circuit for enabling a subsequent memory device in a cascade of memory devices; the cascade circuit being operatively connected to the memory controller.

The cascade circuit may be for controlling a pin-out-to-chip. The cascade circuit may also be for enabling the subsequent memory device.

The memory device may further comprise a device enable input operatively connected to the memory controller.

The memory device may be a non-volatile, solid-state memory device.

According to a second aspect there is provided a method of operating a cascade of a plurality of memory devices connected in series, the method comprising:
(a) a microcontroller enabling a first memory device; and
(b) the first memory device enabling a second memory device connected in series to the first memory device.

The microcontroller may have a single chip-select pin and connect for enabling the plurality of memory devices. The single chip select pin and connect may be operatively connected to a device enable input of the first memory device, the device enable input being operatively connected to a memory controller of the first memory device. The first memory device may be a single pin-out-to-chip and connect operatively connected to the second memory device at the second memory device's device enable input. The single pin-out-to-chip may be controlled by a cascade circuit that is operatively connected to the memory controller and the pin-out-to-chip. The cascade circuit may determine when to enable the second memory device based on data from the memory controller. The subsequent memory device may be able to be enabled only when the memory device has concluded writing data to, or reading data from, the memory cell.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF CERTAIN INVENTIVE EMBODIMENTS

Figure 1:
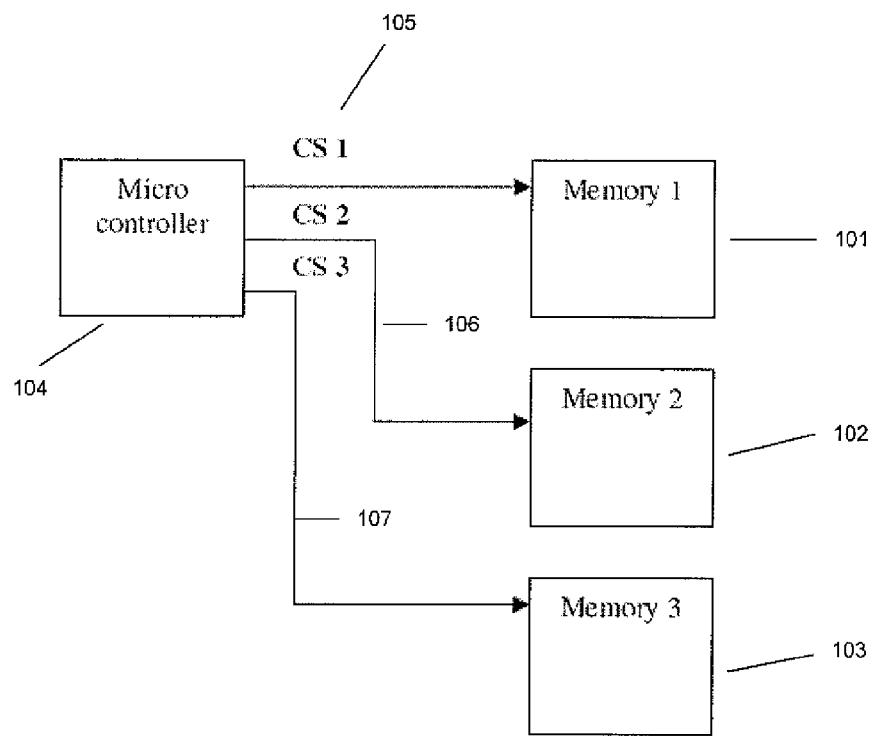
FIG. 1 is a schematic illustration of a prior art multiple device, non-volatile memory system.
Figure 2:
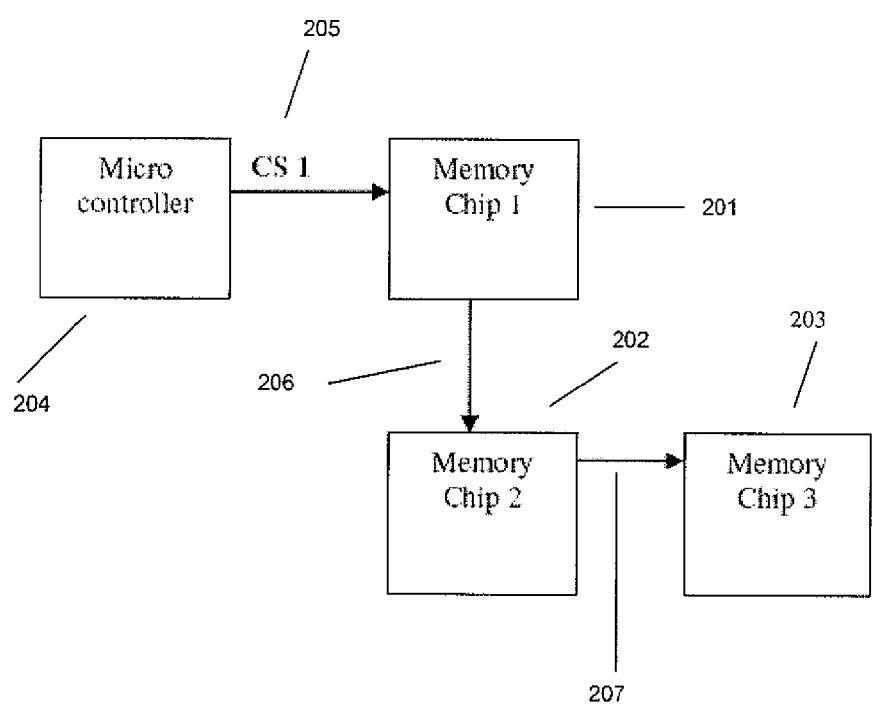
FIG. 2 is a schematic illustration of a preferred embodiment of a multiple non-volatile memory system.
Figure 3:
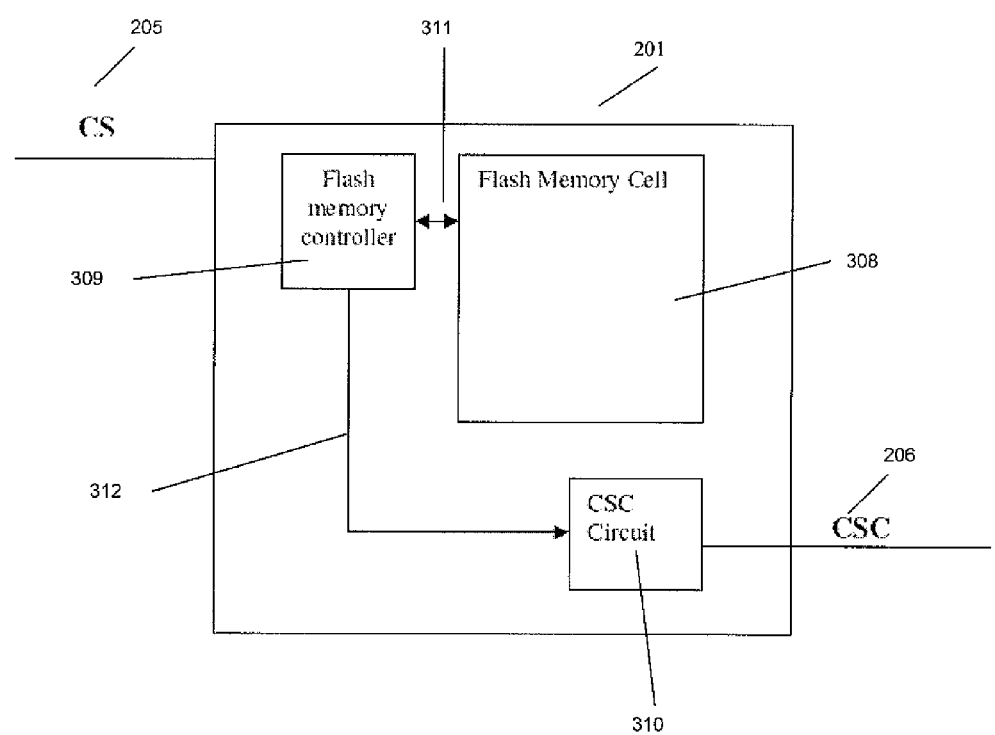
FIG. 3 is a schematic illustration of one of the memory devices of FIG. 2.
Figure 4:
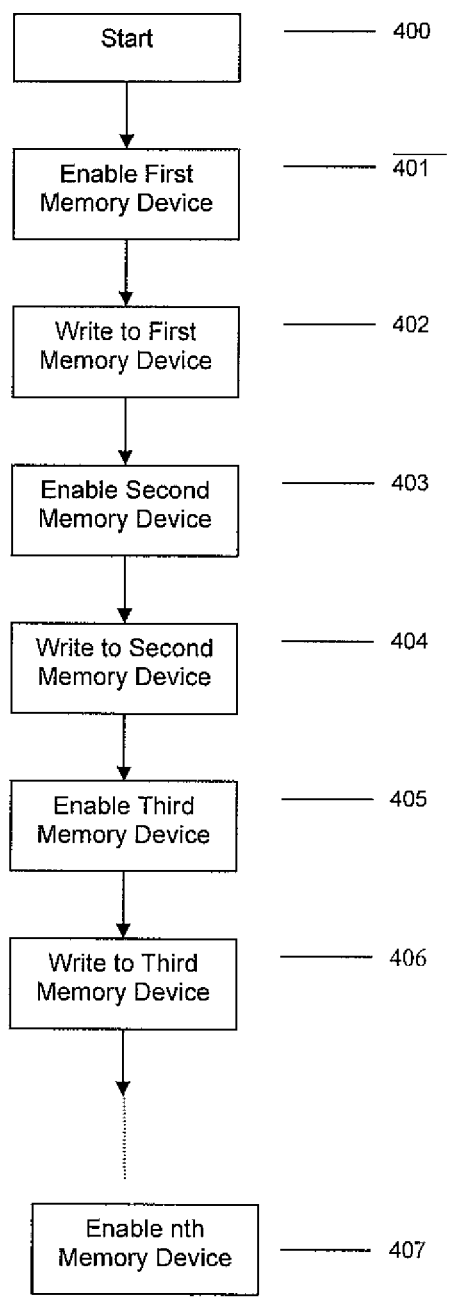
FIG. 4 is a flowchart of the operation of the memory system of FIG. 2.

The embodiments shown in FIGS. 2 to 4 will reduce the number of pins used on a microcontroller 204 to enable it to access multiple memory devices 201, 202 and 203 as microcontroller 204 has only one chip select pin and connect 205. Memories devices 201, 202 and 203 may comprise non-volatile memories such as, for example, flash memory, but may also comprise volatile memory devices. Memory devices 201, 202 and 203 are connected in series, rather than in parallel, as in the prior art of FIG. 1.

The system is such that the microcontroller 204 may use only one chip select 205 to control the three memory devices 201, 202 and 203. The system is suitable for non-volatile, solid-state memory devices where time is required for writing or programming of data into, or reading data from, the memory devices 201, 202 and 203. The system may be configured such that memory device 201, 202 and 203 may have only one device enable input 205 operatively connected to a memory controller 309. The memory controller 309 is operatively connected to a memory cell 308. Each memory device 201, 202, 203 also may have an internal, ("CSC") chip select cascade controller circuit 310 and a pin-out-to-chip 206 to enable memory device 201 to be able to enable a subsequent memory device 202.

This has the advantage that microcontroller 204 may only use one chip select pin and connect 205 whether it is with any number of memory devices from one memory device up to "n" memory devices. Also, all memory devices 201, 202, 203 ... 20n may be the same. This facilities ease of assembly, and reduces inventory. The CSC circuit 310 is operatively connected to memory controller 309.

After starting (400) the microcontroller 204 will first select or enable the memory device 201 (401) and start to write to the buffer of memory device 201 (402). After completing the enabling, the CSC circuit 310 in memory device 201 will enable the memory device 202 (403) when the memory device 201 has finished writing the data into the memory cell 308. The microcontroller 204 can then start writing into the buffer of memory device 202 (404). When the memory device 202 has finished writing data to the memory cell 308 of memory device 202, the CSC circuit 310 in memory device 202 will enable memory device 203 (405) and the microcontroller 204 will write data to the memory cell 308 of memory device 203 (406). This can continue for any required or desired number to memory devices: two, three, four, five, six, and so forth, up to an nth memory device (407).

Each memory device 201, 202, 203 may have a CSC circuit 310 to enable the next memory device in the cascade sequence. The CSC circuit 310 is connected to the flash memory controller 309 to determine if the memory device 201, 202, 203 is in the process of writing to, or reading from, the memory cell 308 so it can enable the next memory device when the memory device has finished writing to, or reading from, the memory cell 308. In one embodiment, only one memory device 201, 202, 203 will be enabled at the one time.

Whilst there has been described in the foregoing description preferred embodiments of the present invention, it will be understood by those skilled in the technology concerned that many variations or modifications in details of design or construction may be made without departing from the present invention.

What is claimed is:

1. An arrangement for cascading non-volatile memory comprising:
    a microcontroller having a single chip select pin;
    a first non-volatile memory device having a first device enable input, a single pin-out-to-chip, a cascade circuit, a memory cell and a memory controller having a memory controller output, the memory controller being operatively connected to the memory cell, the microcontroller being connected to the first non-volatile memory device via a first connection connecting the single chip select pin and the first device enable input, and the microcontroller enables the first non-volatile memory device via the first connection;
    a second non-volatile memory device having a second device enable input, the first non-volatile memory device being connected to the second non-volatile memory device via a second connection connecting the single pin-out-to-chip and the second device enable input;
    wherein the cascade circuit is operatively connected to the memory controller for determining if the first non volatile memory device is in the process of writing to, or reading from, the memory cell, the cascade circuit being responsive to the memory controller output for enabling the second non-volatile memory device via the second connection based on the determination;
    wherein in the arrangement, only the first non-volatile memory device is enabled to be read or written by the microcontroller and only the second non-volatile memory device is enabled to be read or written by the cascade circuit;
    and wherein at most only one of the first non-volatile memory device or the second non-volatile memory device is enabled to be read or written to at any one time.

2. The arrangement as claimed in claim 1, wherein the second non-volatile memory device is configured to be enabled only when the first non-volatile memory device has concluded writing data to, or reading data from the memory cell.

3. The arrangement as claimed in claim 1, wherein the first non-volatile memory device and the second non-volatile memory device are solid-state memory devices.

4. A method of operating a cascade of a plurality of non-volatile memory devices connected in series, the method comprising:
    (a) enabling a first non-volatile memory device with a microcontroller via a first connection, wherein the first connection connects a single chip select pin of the microcontroller to a first device enable input of the first non-volatile memory device, and the first non-volatile memory device having a pin-out-to-chip, a cascade circuit, a memory cell and a memory controller having a memory controller output, the memory controller being operatively connected to the memory cell and the cascade circuit being operatively connected to the memory controller;
    (b) determining if the first non volatile memory device is in the process of writing to, or reading from, the memory cell, the cascade circuit being responsive to the memory controller output;
    (c) enabling a second non-volatile memory device with the cascade circuit via a second connection based on the determination, wherein the second connection connects the pin-out-to-chip to a second device enable input of the second non-volatile memory device, wherein only the first non-volatile memory device is enabled to be read or written by the microcontroller and only the second non-volatile memory device is enabled to be read or written by the cascade circuit, and wherein at most only one of the first non-volatile memory device or the second non-volatile memory device is enabled to be read or written to at any one time.

5. A method as claimed in claim 4, wherein the second non-volatile memory device is able to be enabled only when the first non-volatile memory device has concluded writing data to, or reading data from, a memory cell thereof.

* * * * *

UNITED STATES PATENT AND TRADEMARK OFFICE
CERTIFICATE OF CORRECTION

PATENT NO. : 8,443,132 B2
APPLICATION NO. : 12/189610
DATED : May 14, 2013
INVENTOR(S) : Teng Pin Poo Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 632 days.

Signed and Sealed this
Sixteenth Day of December, 2014

Michelle K. Lee
*Deputy Director of the United States Patent and Trademark Office*